(12) United States Patent
Ko et al.

(10) Patent No.: US 9,412,434 B1
(45) Date of Patent: Aug. 9, 2016

(54) SEMICONDUCTOR DEVICE AND SEMICONDUCTOR SYSTEM FOR PERFORMING AN INITIALIZATION OPERATION

(71) Applicant: SK hynix Inc., Icheon-si, Gyeonggi-do (KR)

(72) Inventors: Bok Rim Ko, Seoul (KR); Haeng Seon Chae, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/822,365

(22) Filed: Aug. 10, 2015

(30) Foreign Application Priority Data

May 11, 2015 (KR) .................. 10-2015-0065620

(51) Int. Cl.
*G06F 1/28* (2006.01)
*G11C 11/4072* (2006.01)
*G11C 11/406* (2006.01)

(52) U.S. Cl.
CPC ...... *G11C 11/4072* (2013.01); *G11C 11/40607* (2013.01); *G11C 11/40611* (2013.01)

(58) Field of Classification Search
USPC ........ 713/300, 322; 307/31, 39; 365/229, 228
See application file for complete search history.

(56) References Cited

U.S. PATENT DOCUMENTS

| | | | | |
|---|---|---|---|---|
| 6,317,657 B1* | 11/2001 | George | ............ | G06F 1/30 365/222 |
| 6,848,058 B1* | 1/2005 | Sinclair | ............ | G06F 1/3203 713/322 |
| 6,981,159 B2* | 12/2005 | Maeda | ............ | G06F 1/30 365/228 |
| 7,764,562 B2* | 7/2010 | Cheon | ............ | G11C 5/147 365/185.03 |
| 8,780,662 B2* | 7/2014 | Lee | ............ | G11C 11/40611 365/189.05 |
| 2012/0127817 A1 | 5/2012 | Fujishiro | | |

FOREIGN PATENT DOCUMENTS

KR 20110074341 A 6/2011

* cited by examiner

*Primary Examiner* — Vu Le
(74) *Attorney, Agent, or Firm* — William Park & Associates Ltd.

(57) ABSTRACT

Semiconductor systems are provided. A semiconductor system may include a first semiconductor device and a second semiconductor device. The first semiconductor device may output a command and a power supply voltage. The second semiconductor device may generate pulses of a reset signal for an initialization operation and pulses of an auto-refresh signal for an auto-refresh operation in response to a first reset command generated in response to the command after the power supply voltage reaches a target voltage level. The second semiconductor device may generate the pulses of the reset signal in response to a second reset command generated in response to the command.

20 Claims, 7 Drawing Sheets

SEMICONDUCTOR DEVICE AND SEMICONDUCTOR SYSTEM FOR PERFORMING AN INITIALIZATION OPERATION

CROSS-REFERENCE TO RELATED APPLICATIONS

The present application claims priority under 35 U.S.C 119(a) to Korean Application No. 10-2015-0065620, filed on May 11, 2015, in the Korean Intellectual Property Office, which is incorporated herein by reference in its entirety as set forth in full.

BACKGROUND

1. Technical Field

Embodiments of the present disclosure generally relate to a semiconductor device and a semiconductor system for performing an initialization operation.

2. Related Art

In general, a semiconductor device may operate by receiving a power supply voltage. The power supply may be supplied from a device external to the semiconductor device or an external device. A level of the power supply voltage supplied to the semiconductor device may increase up to a target voltage level from a ground voltage level with a constant gradient. If a semiconductor device receives a power supply voltage and starts various operations including a reading operation, a writing operation or the like while the level of the power supply voltage increases up to the target voltage level, a malfunction may occur due to the low power supply voltage level. Thus, the semiconductor device may be designed to start various operations after a level of the power supply voltage reaches a predetermined target voltage level.

A semiconductor device may include various internal circuits for performing various operations including a reading operation, a writing operation or the like. The internal circuits included in the semiconductor device need to be initialized so that internal nodes of the internal circuits have predetermined levels before the various operations are performed. Initializing the internal nodes of the internal circuits allows the internal circuits to perform stable operations after a power supply voltage is supplied to the semiconductor device. In addition, data stored in memory cells of the semiconductor device need to be maintained at stable levels.

SUMMARY

According to an embodiment, there may be provided a semiconductor system. The semiconductor system may include a first semiconductor device and a second semiconductor device. The first semiconductor device may be suitable for outputting a command and a power supply voltage. The second semiconductor device may be suitable for generating pulses of a reset signal for an initialization operation and pulses of an auto-refresh signal for an auto-refresh operation in response to a first reset command generated in response to the command after the power supply voltage reaches a target voltage level. The second semiconductor device may be suitable for generating the pulses of the reset signal in response to a second reset command generated in response to the command.

According to an embodiment, there may be provided a semiconductor device. The semiconductor device may include an initialization control circuit, an initialization circuit, and an auto refresh control circuit. The initialization control circuit may be suitable for generating pulses of a reset signal and pulses of an auto-refresh signal in response to a first reset command generated in response to a command after a power supply voltage reaches a target voltage level. The initialization control circuit may be suitable for generating the pulses of the reset signal in response to a second reset command generated in response to the command. The initialization circuit may be suitable for performing an initialization operation for initializing internal nodes included in an internal circuit to predetermined levels when the pulse of the reset signal is generated. The auto-refresh control circuit may be suitable for controlling an auto-refresh operation for maintaining data stored in memory cells when the pulses of the auto-refresh signal are generated.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to a semiconductor device and a semiconductor system configured to perform an initialization operation.

Figure 1:
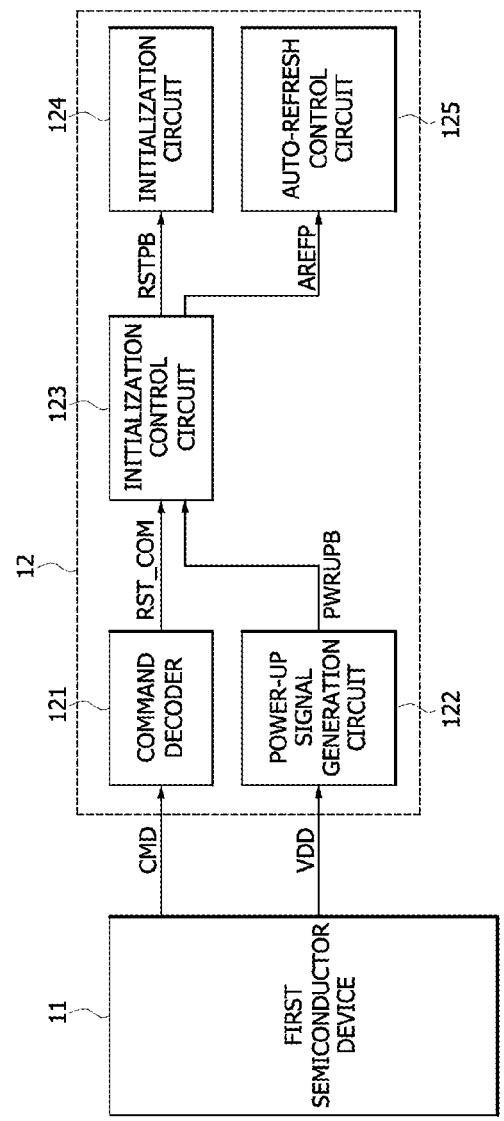
FIG. 1 is a block diagram illustrating a representation of a semiconductor system according to an example of an embodiment.

Referring to FIG. 1, a semiconductor system according to an example of an embodiment may include a first semiconductor device 11 and a second semiconductor device 12. The second semiconductor device 12 may include a command decoder 121, a power-up signal generation circuit 122, and an initialization control circuit 123. The second semiconductor device 12 may include an initialization circuit 124, and an auto-refresh control circuit 125.

The first semiconductor device 11 may apply a command CMD and a power supply voltage VDD to the second semiconductor device 12. The command CMD may include at least one signal and may be transferred to the second semiconductor device 12 through an address line or another line different from the address line according to the various embodiments. A level of the power supply voltage VDD may be set differently according to the various embodiments.

The command decoder 121 may generate a reset command RST_COM by decoding the command CMD. The reset command RST_COM may be generated when a level combination of signals included in the command CMD is identical to a predetermined level combination. The reset command RST_COM may be generated to have a specific logic level or a pulse according to the various embodiments.

The power-up signal generation circuit 122 may detect the level of the power supply voltage VDD to generate a power-up signal PWRUPB. The power-up signal PWRUPB may be set to have a logic low level during a time period (hereinafter, referred to as a power-up period) in which the power supply voltage VDD increases up to a target voltage level and may be set to have a logic high level after the power-up period terminates. The logic level of the power-up signal PWRUPB may be set differently according to the various embodiments.

The initialization control circuit 123 may generate a reset signal RSTPB and an auto-refresh signal AREFP, in response to the reset command RST_COM and the power-up signal PWRUPB. If a first reset command RST_COM is generated after the power-up period terminates, the initialization control circuit 123 may generate pulses of the reset signal RSTPB and pulses of the auto-refresh signal AREFP. If second or the next reset commands RST_COM are generated, the initialization control circuit 123 may generate only the pulses of the reset signal RSTPB without generation of the pulses of the auto-refresh signal AREFP. A configuration and operation of the initialization control circuit 123 will be described below with reference to FIG. 2 later.

If the pulse of the reset signal RSTPB is generated, the initialization circuit 124 may perform an initialization operation so that internal nodes of internal circuits (not illustrated) included in the second semiconductor device 12 have predetermined levels. Before the second semiconductor device 12 starts a normal operation such as a reading operation, a writing operation, or a refresh operation, the initialization circuit 124 may perform various initialization operations for preventing a malfunction of the internal circuits (not illustrated). The initialization operation may be performed in various forms according to the different embodiments.

If the pulses of the auto-refresh signal AREFP are generated, the auto-refresh control circuit 125 may control an auto-refresh operation for stably maintaining data stored in the memory cells (not illustrated) included in the second semiconductor device 12.

Figure 2:
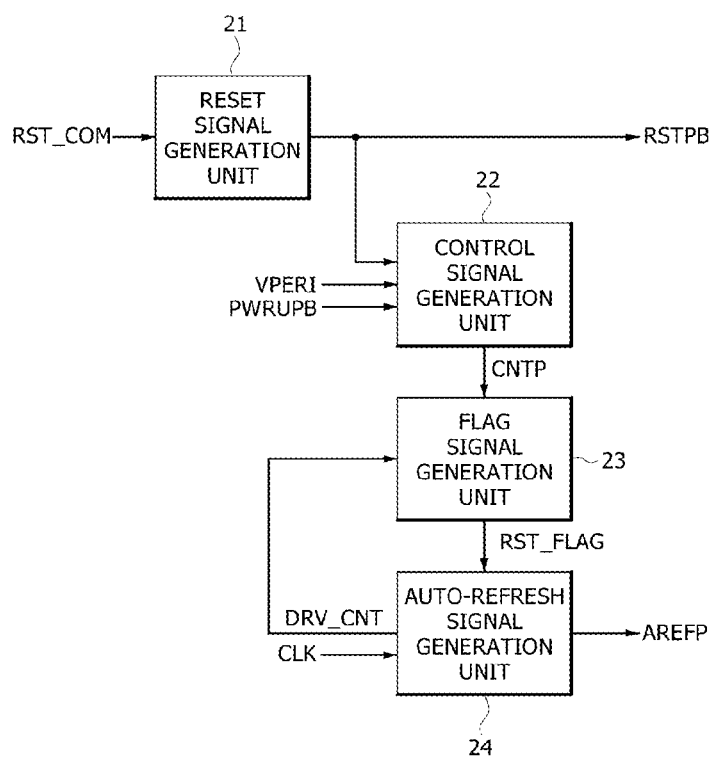
FIG. 2 is a block diagram illustrating a representation of an example of an initialization control circuit included in the semiconductor system illustrated in FIG. 1.

Referring to FIG. 2, the initialization control circuit 123 may include a reset signal generation unit 21, a control signal generation unit 22, and a flag signal generation unit 23. The initialization control circuit 123 may include an auto-refresh signal generation unit 24.

The reset signal generation unit 21 may generate the pulses of the reset signal RSTPB whenever the reset command RST_COM is generated. The reset signal generation unit 21 may be configured to generate the pulse of the reset signal RSTPB in synchronization with a level transition point of the reset command RST_COM or to generate the pulse of the reset signal RSTPB when a pulse of the reset command RST_COM is generated, according to the various embodiments.

The control signal generation unit 22 may generate a pulse of a control signal CNTP in response to the reset signal RSTPB, an internal voltage VPERI, and a power-up signal PWRUPB. For example, if a first pulse of the reset signal RSTPB is generated, the control signal generation unit 22 may buffer a signal of an internal node (nd32 of FIG. 3) to output the buffered signal as the pulse of the control signal CNTP. The level of the internal node (nd32 of FIG. 3) is set in response to the power-up signal PWRUPB. Even if a second or the next pulses of the reset signal RSTPB are generated, the control signal generation unit 22 may terminate generation of the pulse of the control signal CNTP using the internal voltage VPERI. A configuration and operation of the control signal generation unit 22 will be described later with reference to FIG. 3.

The flag signal generation unit 23 may generate a flag signal RST_FLAG in response to the control signal CNTP and a drive control signal DRV_CNT. For example, the flag signal generation unit 23 may generate the flag signal RST_FLAG. The flag signal generation unit 23 may generate the flag signal RST_FLAG enabled, for example, when the control signal CNTP is generated. The flag signal generation unit 23 may generate the flag signal RST_FLAG disabled, for example, when the drive control signal DRV_CNT is enabled. A logic level of the enabled flag signal RST_FLAG and a logic level of the disabled flag signal RST_FLAG may be set differently according to the various embodiments. A configuration and operation of the flag signal generation unit 23 will be described later with reference to FIG. 4.

The auto-refresh signal generation unit 24 may generate the pulses of the auto-refresh signal AREFP and the drive control signal DRV_CNT, in response to the flag signal RST_FLAG and a clock signal CLK. For example, if the flag signal RST_FLAG is enabled, the auto-refresh signal generation unit 24 may generate at least one pulse of the auto-refresh signal AREFP in synchronization with the clock signal CLK. The auto-refresh signal generation unit 24 may generate the drive control signal DRV_CNT enabled after a predetermined time period elapses based on the clock signal CLK from a point of time that the flag signal RST_FLAG is enabled. A logic level of the enabled drive control signal DRV_CNT and the predetermined time period may be set differently according to the various embodiments. A configuration and operation of the auto-refresh signal generation unit 24 will be described later with reference to FIG. 5.

Figure 3:
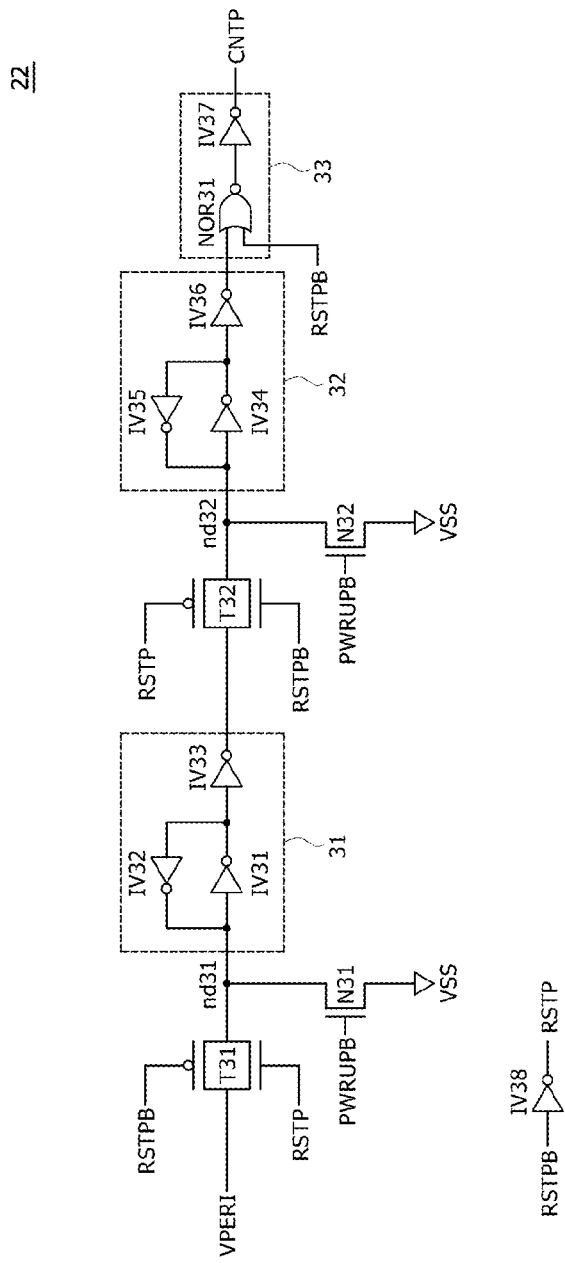
FIG. 3 is a circuit diagram illustrating a representation of an example of a control signal generation unit included in the initialization control circuit illustrated in FIG. 2.

Referring to FIG. 3, the control signal generation unit 22 may include transfer gates T31 and T32, NMOS transistors N31 and N32, a first latch unit 31, a second latch unit 32, and a buffer unit 33. The transfer gate T31 may transmit the internal voltage VPERI to a node nd31 at a point of time that the reset signal RSTPB is changed from a logic high level into a logic low level. The NMOS transistor N31 may drive the node nd31 to a ground voltage VSS in response to the power-up signal PWRUPB, the level of the power-up signal PWRUPB is changed from a logic low level into a logic high level, after the power-up period terminates. The first latch unit 31 may latch, buffer, and output a signal of the node nd31. The first latch unit 31 may include inverters IV31, IV32, and IV33. The transfer gate T32 may transmit an output signal of the first latch unit 31 to a node nd32 at a point of time that the reset signal RSTPB is changed from a logic low level to a logic high level. The NMOS transistor N32 may drive the node nd32 to the ground voltage VSS in response to the power-up signal PWRUPB. The second latch unit 32 may latch, buffer, and output a signal of the node nd32. The second latch unit 32 may include inverters IV34, IV35, and IV36. The buffer unit 33 may buffer an output signal of the second latch unit 32 and output the buffered output signal as the control signal CNTP, at a point of time that the reset signal RSTPB is changed from a logic high level to a logic low level. The buffer unit 33 may include logic gates. For example, the buffer unit 33 may include a NOR gate NOR31 configured to receive the output of the second latch unit 32 and the reset signal RSTPB. The output of the NOR gate NOR31 may be received by the inverter IV37. The inverter IV37 may output the control signal CNTP. An inverter IV38 may inversely buffer the reset signal RSTPB to generate an inverted reset signal RSTP.

When the first pulse of the reset signal RSTPB is generated, the control signal generation unit 22 having an aforementioned configuration may buffer a signal of the internal node nd32 which is set to have a logic low level, using the second latch unit 32 and the buffer unit 33, in response to the power-up signal PWRUPB, and may output the buffered signal as the pulse of the control signal CNTP. Meanwhile, even if the second or the next pulses of the reset signal RSTPB are generated, the control signal generation unit 22 may terminate generation of the pulse of the control signal CNTP in response to the signals of the internal nodes nd31 and nd32 which are set to have a logic high level by the internal voltage VPERI.

Figure 4:
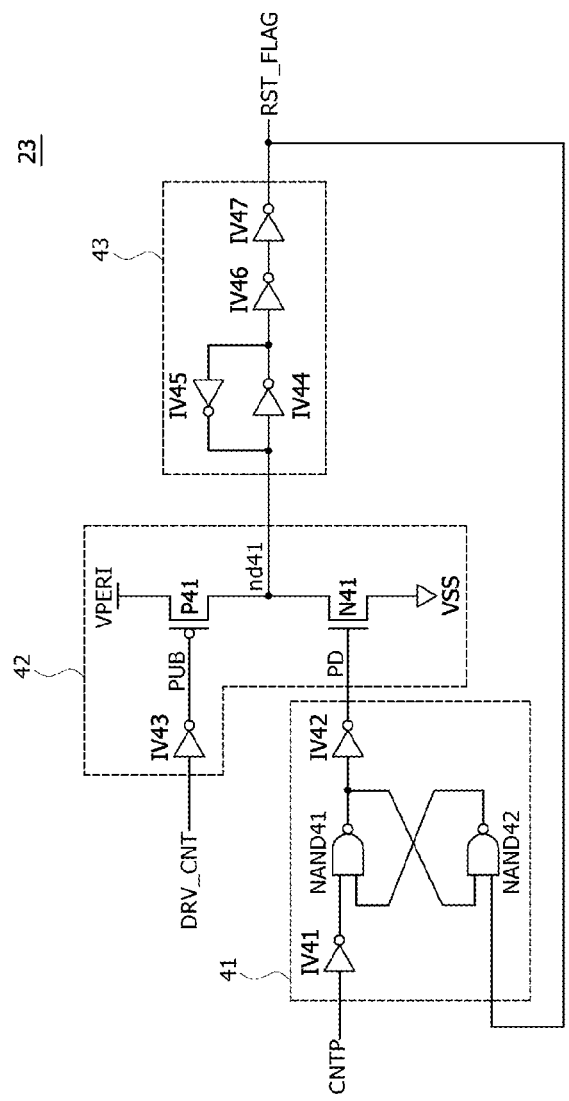
FIG. 4 is a circuit diagram illustrating a representation of an example of a flag signal generation unit included in the initialization control circuit illustrated in FIG. 2.

Referring to FIG. 4, the flag signal generation unit 23 may include a pull-down signal generation unit 41, a drive unit 42, and an output unit 43. The pull-down signal generation unit 41 may include inverters IV41 and IV42, and NAND gates NAND41 and NAND42. If the pulse of the control signal CNTP is inputted to the pull-down signal generation unit 41 while the flag signal RST_FLAG is enabled to have a logic low level, the pull-down signal generation unit 41 may generate a pull-down signal PD enabled to have a logic high level. The pull-down signal generation unit 41 may generate the pull-down signal PD disabled to have a logic low level while the control signal CNTP has a logic high level. The drive unit 42 may include an inverter IV43, a PMOS transistor P41, and an NMOS transistor N41. When the pull-down signal PD enabled to have a logic high level is input to the drive unit 42, the drive unit 42 may pull down a voltage of a node nd41 to the ground voltage VSS. When the drive control signal DRV_CNT enabled to have a logic high level is inputted to the drive unit 42, the drive unit 42 may generate a pull-up signal PUB enabled to have a logic low level, and may pull up a voltage of the node nd41 to the internal voltage VPERI. The output unit 43 may be configured to include inverters IV44, IV45, IV46, and IV47 and may buffer a signal of the node nd41 to generate the flag signal RST_FLAG.

The flag signal generation unit 23 having an aforementioned configuration may generate the flag signal RST_FLAG enabled when the pulse of the control signal CNTP is generated and may generate the flag signal RST_FLAG disabled when the drive control signal DRV_CNT is enabled.

Figure 5:
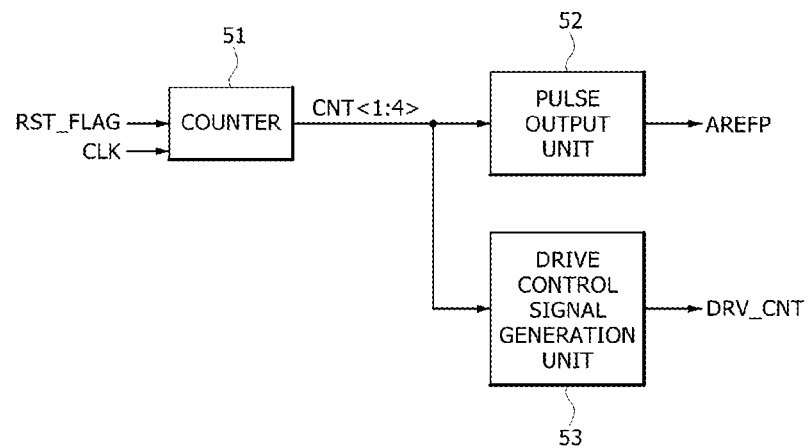
FIG. 5 is a block diagram illustrating a representation of an example of an auto-refresh signal generation unit included in the initialization control circuit illustrated in FIG. 2.

Referring to FIG. 5, the auto-refresh signal generation unit 24 may include a counter 51, a pulse output unit 52, and a drive control signal generation unit 53. The counter 51 may output a counting signal CNT<1:4> that may be sequentially counted in synchronization with the clock signal CLK in a time period that the flag signal RST_FLAG is enabled. The pulse output unit 52 may be configured to generate the pulses of the auto-refresh signal AREFP whenever the counting signal CNT<1:4> is counted. The drive control signal generation unit 53 may generate the drive control signal DRV_CNT enabled when the counting signal CNT<1:4> has a predetermined level combination.

An example of an operation of the auto-refresh signal generation unit 24 having an aforementioned configuration will be described hereinafter under the assumption, for example, that the counting signal CNT<1:4> is counted up by one bit in a sequence of '0000', '0001', '0010', . . . while the flag signal RST_FLAG is enabled and the predetermined level combination of the counting signal CNT<1:4> is set, for example, to be '0110'.

The auto-refresh signal generation unit 24 may generate the pulses of the auto-refresh signal AREFP, when the counting signal CNT<1:4> has level combinations of '0001', '0010', '0011', '0100', '0101', and '0110'. In addition, the auto-refresh signal generation unit 24 may generate the drive control signal DRV_CNT enabled when the counting signal CNT<1:4> has a level combination of '0110'. A level combination of '0001' means that a first counting signal CNT<1> has a logic high level and all of second to fourth counting signals CNT<2:4> have a logic low level.

Figure 6:
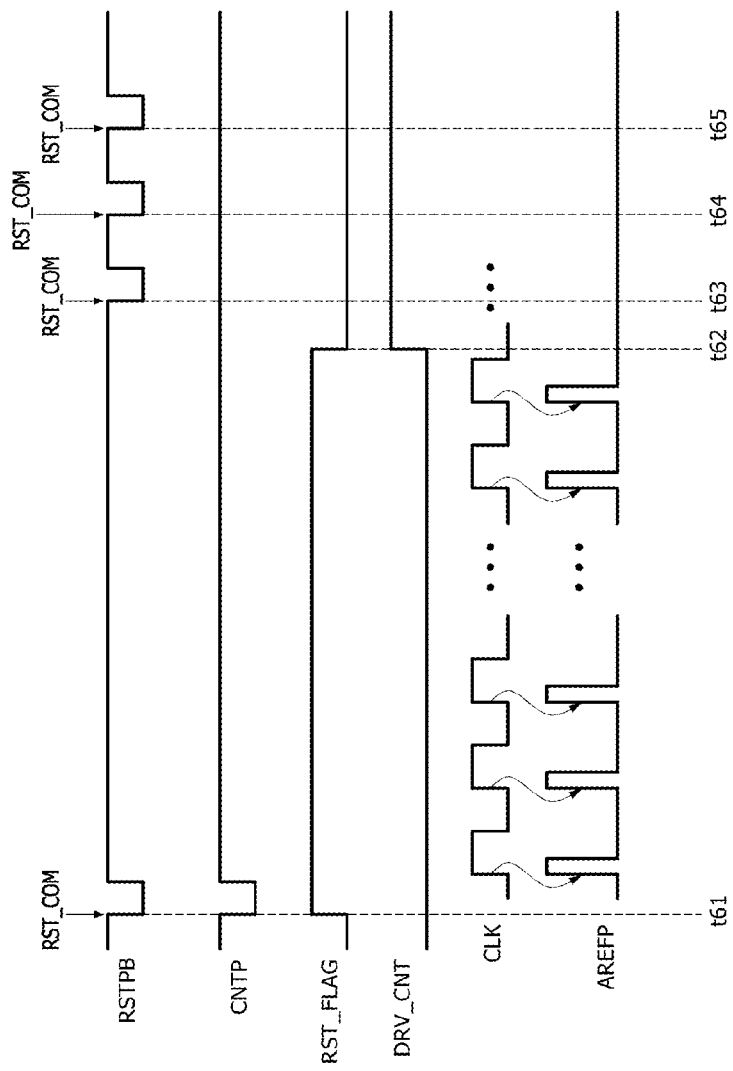
FIG. 6 is a timing diagram illustrating a representation of an example of an operation of the semiconductor system illustrated in FIGS. 1 to 5.

An example of an operation of the semiconductor system set forth with reference to FIGS. 1 to 5 will be described hereinafter with reference to FIG. 6.

When the reset command RST_COM is generated at a point of time "t61", the first pulse of the reset signal RSTPB may be generated. An initialization operation for initializing internal nodes of internal circuits (not illustrated) included in the second semiconductor device 12 to predetermined levels may be performed in response to the first pulse of the reset signal RSTPB. The first pulse of the reset signal RSTPB may be transferred as the pulse of the control signal CNTP. The flag signal RST_FLAG may be enabled to a logic high level by the pulse of the control signal CNTP. The flag signal RST_FLAG may be disabled to a logic low level by the drive control signal DRV_CNT which is enabled to a logic high level at a point of time that a predetermined time period from a point of time "t61" till a point of time "t62" elapses. The predetermined time period from the point of time "t61" till the point of time "t62" may be set in accordance with a level combination of the counting signal CNT<1:4> which is generated from the auto-refresh signal generation unit 24. The pulses of the auto-refresh signal AREFP may be generated in response to the counting signal CNT<1:4> that is counted in synchronization with the clock signal CLK while the flag signal RST_FLAG is enabled to have a logic high level. When the pulses of the auto-refresh signal AREFP are generated, an auto-refresh operation for stably maintaining the data stored in the memory cells (not illustrated) included in the second semiconductor device 12 may be performed.

When the reset command RST_COM is generated at points of time "t63", "t64", and "t65", the second pulse, the third pulse, and the fourth pulse of the reset signal RSTPB may be generated at the points of time "t63", "t64" and "t65", respectively. Therefore, an initialization operation for initializing the internal nodes of the internal circuits (not illustrated) included in the second semiconductor device 12 to the predetermined levels may be performed. Meanwhile, the second pulse, the third pulse, and the fourth pulse of the reset signal RSTPB may not be transferred as the pulse of the control signal CNTP. Thus, the pulses of the auto-refresh signal AREFP for controlling the auto-refresh operation may not be generated.

As described above, when the first reset command RST_COM is generated, the semiconductor system according to an embodiment may perform an initialization operation for initializing the internal nodes of the internal circuits (not illustrated) included in the second semiconductor device 12 to the predetermined levels and an auto-refresh operation for refreshing the data stored in the memory cells (not illustrated) included in the second semiconductor device 12. As a result, the internal circuits and memory cells included in the second semiconductor device may all be initialized stably. When the second or the next reset commands RST_COM are generated, only the initialization operation may be performed to prevent a malfunction of the auto-refresh signal AREFT that occurs due to irregular input of the reset command RST_COM.

Figure 7:
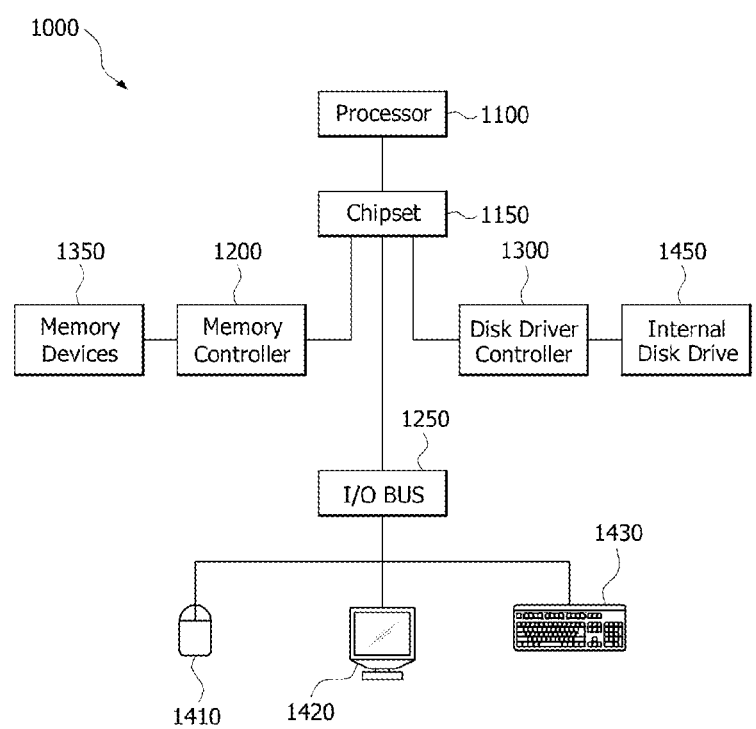
FIG. 7 illustrates a block diagram of an example of a representation of a system employing a semiconductor system and or semiconductor device in accordance with the various embodiments discussed above with relation to FIGS. 1-6.

The semiconductor devices and/or semiconductor systems discussed above (see FIGS. 1-6) are particular useful in the design of memory devices, processors, and computer systems. For example, referring to FIG. 7, a block diagram of a system employing a semiconductor device and/or semiconductor system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or semiconductor system as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or semiconductor system as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor device and/or semiconductor system as discussed above with relation to FIGS. 1-6. In alternate embodiments, such as, for example but not limited to, cellular phones or digital cameras, the components may differ from the embodiments illustrated in FIG. 7.

What is claimed is:

1. A semiconductor system comprising:
   a first semiconductor device suitable for outputting a command and a power supply voltage; and
   a second semiconductor device suitable for generating pulses of a reset signal for an initialization operation and pulses of an auto-refresh signal for an auto-refresh operation in response to a first reset command generated in response to the command and suitable for generating the pulses of the reset signal in response to a second reset command generated in response to the command, after the power supply voltage reaches a target voltage level.

2. The semiconductor system of claim 1, wherein the second semiconductor device terminates generation of the pulses of the auto-refresh signal in response to the second reset command.

3. The semiconductor system of claim 1, wherein the second semiconductor device includes a command decoder suitable for generating the first and second reset commands by decoding the command.

4. The semiconductor system of claim 1,
   wherein the second semiconductor device generates a power-up signal in response to the power supply voltage; and
   wherein the power-up signal has a first level during a power-up period before the power supply voltage reaches the target voltage level and has a second level after the power-up period terminates.

5. The semiconductor system of claim 1, wherein the second semiconductor device includes an initialization control circuit suitable for controlling the generation of the pulses of the reset signal and the auto-refresh signal in response to a power-up signal and the first and second reset commands.

6. The semiconductor system of claim 5, wherein the second semiconductor device further includes:
   an initialization circuit suitable for performing the initialization operation for initializing internal nodes included in an internal circuit to predetermined levels when the pulse of the reset signal is generated.

7. The semiconductor system of claim 5, wherein the second semiconductor device further includes:
   an auto-refresh control circuit suitable for performing an auto-refresh operation for maintaining data stored in memory cells when the pulses of the auto-refresh signal are generated.

8. The semiconductor system of claim 5, wherein the initialization control circuit includes:
   a reset signal generation unit suitable for generating the pulses of the reset signal in response to the first and second reset commands;
   a control signal generation unit suitable for generating a control signal in response to the reset signal, the power-up signal, and an internal voltage;
   a flag signal generation unit suitable for generating a flag signal in response to the control signal and a drive control signal; and
   an auto-refresh signal generation unit suitable for generating the drive control signal and the pulses of the auto-refresh signal in response to the flag signal and a clock signal.

9. The semiconductor system of claim 8,
wherein the control signal generation unit buffers a voltage of an internal node set by the power-up signal to output the buffered voltage as the control signal when a first pulse of the reset signal is generated according to the first reset command; and
wherein the control signal generation unit buffers the internal voltage to output the buffered internal voltage as the control signal when a second pulse of the reset signal is generated.

10. The semiconductor system of claim 8, wherein the control signal generation unit includes:
a first transfer gate suitable for transmitting the internal voltage to a first internal node in response to the reset signal;
a first level setting element suitable for setting a voltage level of the first internal node in response to the power-up signal;
a first latch unit suitable for latching, buffering, and outputting a voltage of the first internal node;
a second transfer gate suitable for transmitting an output signal of the first latch unit to a second internal node in response to the reset signal;
a second level setting element suitable for setting a voltage level of the second internal node in response to the power-up signal;
a second latch unit suitable for latching, buffering, and outputting a voltage of the second internal node; and
a buffer unit suitable for buffering an output signal of the second latch unit in response to the reset signal to output the buffered signal as the control signal.

11. The semiconductor system of claim 8, wherein the flag signal generation unit generates the flag signal enabled when a pulse of the control signal is generated and disables the flag signal when the drive control signal is enabled.

12. The semiconductor system of claim 11, wherein the flag signal generation unit includes:
a pull-down signal generation unit suitable for generating a pull-down signal enabled when the pulse of the control signal is generated and disabled when the flag signal is enabled;
a drive unit suitable for pulling up a voltage of an internal node in response to the drive control signal and suitable for pulling down the voltage of the internal node in response to the pull-down signal; and
an output unit suitable for latching, buffering, and outputting a signal of the internal node.

13. The semiconductor system of claim 8, wherein the auto-refresh signal generation unit includes:
a counter suitable for generating a counting signal, the counting signal counted in synchronization with the clock signal while the flag signal is enabled;
a pulse output unit suitable for generating pulses of the auto-refresh signal in response to the counting signal; and
a drive control signal generation unit suitable for generating the drive control signal in response to the counting signal.

14. A semiconductor device comprising:
an initialization control circuit suitable for generating pulses of a reset signal and pulses of an auto-refresh signal in response to a first reset command generated in response to a command after a power supply voltage reaches a target voltage level and suitable for generating the pulses of the reset signal in response to a second reset command generated in response to the command;
an initialization circuit suitable for performing an initialization operation for initializing internal nodes included in an internal circuit to predetermined levels when the pulse of the reset signal is generated; and
an auto-refresh control circuit suitable for controlling an auto-refresh operation for maintaining data stored in memory cells when the pulses of the auto-refresh signal are generated.

15. The semiconductor device of claim 14, wherein the initialization control circuit includes a reset signal generation unit suitable for generating the pulses of the reset signal in response to the first and second reset commands.

16. The semiconductor device of claim 15, wherein the initialization control circuit further includes a control signal generation unit suitable for generating a control signal in response to the reset signal, a power-up signal, and an internal voltage.

17. The semiconductor device of claim 16,
wherein the control signal generation unit buffers a voltage of the internal node set by the power-up signal to output the buffered voltage as the control signal when a first pulse of the reset signal is generated according to the first reset command; and
wherein the control signal generation unit buffers the internal voltage to output the buffered internal voltage as the control signal when a second pulse of the reset signal is generated.

18. The semiconductor device of claim 16, wherein the initialization control circuit further includes a flag signal generation unit suitable for generating a flag signal in response to the control signal and a drive control signal.

19. The semiconductor device of claim 18, wherein the flag signal generation unit generates the flag signal enabled when a pulse of the control signal is generated and disables the flag signal when the drive control signal is enabled.

20. The semiconductor device of claim 18, further comprising:
an auto-refresh signal generation unit suitable for generating the drive control signal and the pulses of the auto-refresh signal in response to the flag signal and a clock signal.

* * * * *